United States Patent
Gekat et al.

(10) Patent No.: US 8,971,208 B2
(45) Date of Patent: *Mar. 3, 2015

(54) MULTI-CHANNEL RADIO-FREQUENCY RECEIVER

(71) Applicant: Selex ES GmbH, Neuss (DE)

(72) Inventors: Frank Gekat, Rosrath (DE); Dieter Ruhl, Dusseldorf (DE)

(73) Assignee: Selex ES GmbH, Neuss (DE)

( * ) Notice: Subject to any disclaimer, the term of this patent is extended or adjusted under 35 U.S.C. 154(b) by 0 days.

This patent is subject to a terminal disclaimer.

(21) Appl. No.: 14/272,777

(22) Filed: May 8, 2014

(65) Prior Publication Data

US 2014/0242932 A1   Aug. 28, 2014

Related U.S. Application Data

(63) Continuation-in-part of application No. 11/989,089, filed as application No. PCT/EP2006/006865 on Jul. 13, 2006, now Pat. No. 8,824,986.

(30) Foreign Application Priority Data

Jul. 21, 2005 (DE) .......................... 10 2005 034 032

(51) Int. Cl.
| | |
|---|---|
| H04L 12/28 | (2006.01) |
| H04B 1/16 | (2006.01) |
| H03G 3/30 | (2006.01) |
| H04B 1/10 | (2006.01) |
| H03F 1/02 | (2006.01) |
| H03F 3/189 | (2006.01) |
| H03F 3/72 | (2006.01) |
| H04J 1/16 | (2006.01) |

(52) U.S. Cl.
CPC ............... *H04B 1/16* (2013.01); *H03G 3/3036* (2013.01); *H04B 1/1027* (2013.01); *H03F 1/0277* (2013.01); *H03F 3/189* (2013.01); *H03F 3/72* (2013.01); *H03F 2200/192* (2013.01); *H03F 2200/294* (2013.01); *H03F 2200/411* (2013.01); *H03F 2203/7221* (2013.01); *H03F 2203/7236* (2013.01)
USPC ............ 370/252; 370/329; 370/419; 370/430

(58) Field of Classification Search
USPC ................................... 370/252, 329, 419, 430
See application file for complete search history.

(56) References Cited

U.S. PATENT DOCUMENTS

| | | | | |
|---|---|---|---|---|
| 4,933,641 | A * | 6/1990 | Hsiung et al. ................. | 327/351 |
| 6,151,354 | A * | 11/2000 | Abbey .......................... | 375/211 |
| 7,058,364 | B2 * | 6/2006 | Atkinson et al. ................ | 455/76 |
| 7,366,486 | B2 * | 4/2008 | Vorenkamp et al. ......... | 455/182.3 |
| 8,559,579 | B2 * | 10/2013 | Staszewski et al. ........... | 375/362 |
| 2005/0245199 | A1 * | 11/2005 | Batra et al. ...................... | 455/73 |

* cited by examiner

*Primary Examiner* — John Pezzlo

(74) *Attorney, Agent, or Firm* — Kilpatrick Townsend & Stockton LLP

(57) ABSTRACT

The invention relates to a multichannel radio-frequency receiver for electromagnetic waves, having a radio-frequency analogue section, which has an input for an electrical signal from a reception device, and having a lower-frequency section, which is connected downstream of the radiofrequency analogue section and has a plurality of parallel channels (6*b*, 6*c*; 7*b*, 7*c*) for in each case different signal levels and an evaluation circuit, in which, in the radiofrequency analogue section in order to split the signal in accordance with a predeterminable division ratio into signal elements which can be supplied to radio-frequency analogue channels (6*a*, 7*a*), downstream from which the channels (6*b*, 6*c*; 7*b*, 7*c*) of the lower-frequency section are respectively connected, and the channels (6*b*, 6*c*; 7*b*, 7*c*) of the lower-frequency section each have an evaluation circuit for detection of the phase and amplitude of the respective signal element.

20 Claims, 6 Drawing Sheets

MULTI-CHANNEL RADIO-FREQUENCY RECEIVER

CROSS REFERENCE TO RELATED APPLICATIONS

This application is a continuation in part of U.S. patent application Ser. No. 11/989,089 filed Jan. 18, 2008 and entitled "MULTI-CHANNEL RADIOFREQUENCY RECEIVER," which is a U.S. National Stage entry of PCT/EP2006/006865 filed Jul. 13, 2006 and entitled "MULTI-CHANNEL RADIOFREQUENCY RECEIVER," which claims priority to German Patent Application No. 10 2005 034 032.6 filed Jul. 21, 2005 and entitled "MULTI-CHANNEL RADIOFREQUENCY RECEIVER", the complete disclosures of which are herein incorporated by reference.

BACKGROUND OF THE INVENTION

The invention relates to a multichannel radio-frequency receiver.

In radio-frequency receivers for radar systems, communication appliances, test equipment etc., the dynamic range is limited by the electronic components that are used, and in the case of digital processing in particular the analogue/digital converters that are used.

In order to increase the dynamic range, it is known from GB 2 204 200 A for a received radio-frequency signal to be matched to the dynamic range of the components that are used by variable amplification after conversion to an intermediate frequency followed by conversion to a baseband frequency, by means of automatic gain control (AGC). However, the variable gain adversely affects the signal quality. In order to make it possible to react to rapid changes in the signal strength, the useful signal must also be delayed with respect to the actuating signal since, otherwise, the automatic gain control cannot carry out the control process before the useful signal arrives at an assembly which limits the dynamic range. This can be achieved only with a great amount of complexity. Finally, the gain setting of the AGC must be known accurately for calibration of measuring radars, in particular meteorological radars.

As an alternative to automatic gain control, EP 0 660 539 B1 proposes that a signal be split into three channels after the radio-frequency signal has been converted to an intermediate frequency. One channel has an amplifier and is supplied to one input of a multiplexer, a further channel is supplied without any change to a further input of the multiplexer, and the last channel has a detector for the signal strength and is connected to a control input of the multiplexer in order to pass on either the amplified channel or the unamplified channel to a common evaluation circuit for the signal, depending on the signal strength. However this requires an additional channel which is not used in the signal evaluation and, furthermore, reduces the signal strength on the other two channels. In addition, the multiplexer corrupts the signal that is passed on to the evaluation circuit, in particular during switching, so that the known receiver is not suitable for signals in which weak amplitudes frequently alternate with strong amplitudes. Finally, the components upstream of the signal divider must be designed for the entire dynamic range of the receiver, and are therefore subject to compromise.

BRIEF SUMMARY OF THE INVENTION

The invention is therefore based on the object of providing a multichannel radio-frequency receiver that allows better-quality evaluation, with a simplified design.

This object is achieved on the basis of the features of Claim 1.

This results in a multichannel radio-frequency receiver in which a signal divider for splitting a radio-frequency analogue electrical signal from a receiving device such as a radar antenna or a test equipment head into signal elements which can be supplied to radio-frequency analogue channels is actually provided in a radio-frequency analogue section downstream from each of which channels of a lower-frequency section of the radio-frequency receiver are in each case connected and each have an evaluation circuit for detection of the phase and amplitude of the respective signal element.

In the simplest case, all the sections which follow the signal divider are designed identically. This makes it possible to achieve a further cost reduction.

The splitting of the signal in the radio-frequency area itself between channels which are used exclusively for signal processing and evaluation allows optimum use of the available signal strength, as well as optimum design, without any compromises, of all the signal-processing, and in particular signal-evaluating components of the receiver, depending on the signal strengths to be evaluated in the respective channels. Noise, signal distortion and other signal corruption are therefore minimized.

It is possible to provide for the signal to be split into signal elements even before the first amplification process. This results in a further evaluation improvement.

It is possible to provide for a signal limiter to be connected downstream from the signal divider. This makes it possible to block or limit signals which are too strong for one channel or for a plurality of channels. The only signals which are preferably passed on for processing on a channel are those which do not overdrive the components in that channel. In addition to protecting the channels against overvoltage damage, the use of a signal limiter also makes it possible to detect signals on other channels during a blind time on one channel. The blind time is the time which a gas-discharge-based signal limiter requires in order to quench gas-discharge paths, and is normally longer than a transmission pulse from a radar apparatus. In radio-frequency receivers with an input signal limiter on the input side which blocks the entire radio-frequency receiver, it is therefore possible to avoid the occurrence of so-called blind spots or blind rings.

It is possible to provide for a plurality of signal dividers to be connected in series, in the form of a cascade, in order to scale the dynamic range virtually indefinitely.

It is possible to provide for a signal limiter to be connected downstream from the signal divider, and for a further signal divider to be connected downstream from the signal limiter. This makes it possible to use a single signal divider to protect a plurality of channels.

It is possible to provide for a frequency converter for converting the respective radio-frequency signal element to a signal element at an intermediate frequency to be provided in the lower-frequency section in each channel. The signal elements can be processed at the intermediate-frequency level using simple means and with high quality.

It is possible to provide for the evaluation circuits to be matched to the respective signal strength, with the matching being carried out in particular by the choice and design of the components used. The matching is then carried out by the division ratio of the signal or by the channels having permanently set different gains, or by both.

It is possible to provide for the evaluation circuits each to have an analogue/digital converter for digitizing the respective signal element. This allows independent digital further processing for each channel, in particular using a signal processor or computer.

It is possible to provide for the evaluation circuits each to have a demodulator. This allows independent processing for each channel.

The radio-frequency receiver may be designed for radio-frequency electromagnetic waves including the microwave range, or only the microwave range, and in particular for a radar device, for example a weather radar device.

The signal strength in this case optionally refers to the maximum amplitude or the maximum intensity of the signal.

Further refinements of the invention can be found in the following description and in the dependent claims.

BRIEF DESCRIPTION OF THE DRAWINGS

The invention will be explained in more detail in the following text with reference to exemplary embodiments which are illustrated in the attached figures.

DETAILED DESCRIPTION OF THE INVENTION

Figure 1:
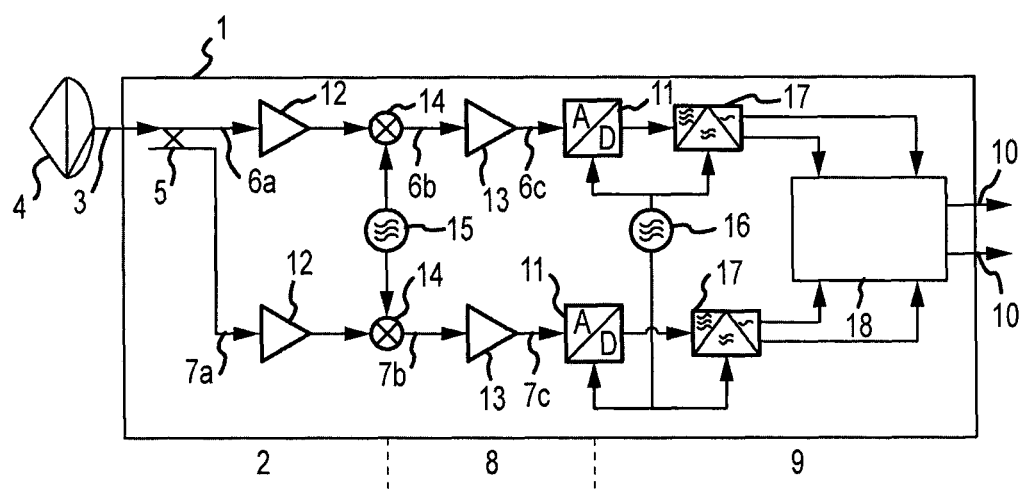
FIG. 1 shows a block diagram of a radio-frequency receiver.

The radio-frequency receiver 1, which is illustrated in a simplified form in FIG. 1, has a radio-frequency analogue section 2 with an input 3 for an analogue, radio-frequency, electrical signal of a receiving device 4, for example in the form of a parabolic antenna for an electromagnetic radar beam at a wavelength in particular in the microwave range, having a signal divider 5 and having two channels 6a, 7a. An analogue intermediate-frequency section 8 with channels 6b, 7b follows the radio-frequency section 2. Finally, a digital baseband-frequency section 9 with channels 6c, 7c and outputs 10 for data signals which correspond to the analogue radio-frequency electrical signal, in particular in amplitude and phase, follows the analogue intermediate-frequency section 8.

The expediently passive signal divider 5 is, for example, a directional coupler and in this case splits the signal received from the input 3 into two possibly in-phase signal elements with the same or a different signal element strength, which are each processed separately in the channels 6, 7. If required, more than two signal elements and a corresponding number of channels are provided.

The dynamic range of the channels 6, 7 is in this case limited in particular by the dynamic range of the respective analogue/digital converters 11 and, to the extent described, the signal divider 5 is arranged upstream of low-noise amplifiers 12, as well as by their dynamic range. In order to widen the dynamic range in comparison to single-channel evaluation, the channels 6, 7 are designed for respectively different signal strengths such that the dynamic range of the respective analogue/digital converter 11 and, if appropriate, low-noise amplifier 12 is used optimally. The channels 6, 7 can be designed for different signal strengths by suitable choice of the division ratio of the signal divider 5 and/or the gain of low-noise amplifiers 12, 13 provided in the channels. By way of example, the following text is based on the assumption that the aim is to process low signal strengths in the channel 6, and high signal strengths in the channel 7.

Figure 2:
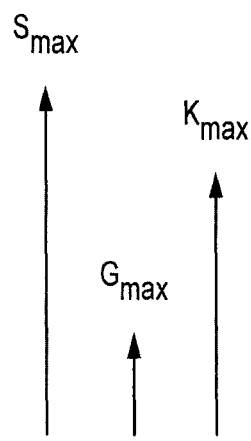
FIGS. 2, 3 and 4 illustrate signal elements at respectively different points in the radio-frequency receiver shown in FIG. 1.

The division ratio, which can be predetermined by the configuration of the signal divider 5 and may additionally be variable, is, for example, 3:1, that is to say the strength of the signal element in the channel 6a is three times the strength of the signal element in the channel 7a and three quarters of the strength of the undivided signal, while the strength of the signal element in the channel 7a is one third of the strength of the signal element in the channel 6a, and one quarter of the strength of the undivided signal. The maximum signal element strength $K_{max}$ and $G_{max}$ of the signal elements in the channels 6a and 7a, respectively, for the maximum permissible signal strength $S_{max}$ at the input 3 is illustrated in FIG. 2. Other division ratios, in particular 1:1, are likewise possible and may be combined with further gain ratios, with the gain ratios expediently being different if the division ratio is 1:1.

Figure 3:
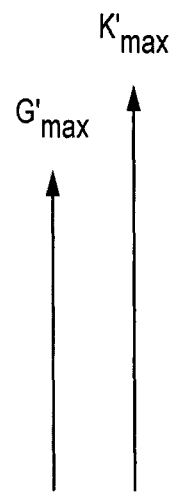

The low noise amplifiers (LNA) 12 which are in each case connected in the radio-frequency section downstream from the signal divider 5 in the channels 6a, 7a have different gains in this case. The amplifier 12 in the channel 7a for high signal strengths has to provide less gain than the amplifier 12 in the channel 6a. The maximum signal strengths $K'_{max}$ and $G'_{max}$ of the amplified maximum signal elements that occur are illustrated in FIG. 3, with the magnitude ratios being distorted in comparison to FIG. 2, because the gain is expediently several orders of magnitude. Instead of or in addition to the amplifiers 12, a low-noise amplifier can be provided upstream of the signal divider 5. However, it is particularly advantageous to use identical gains in the channels, in order to allow the channels to be designed with the same circuitry at low cost, in which case the signal divider is then responsible for splitting the signal strengths expediently between the channels.

Figure 4:
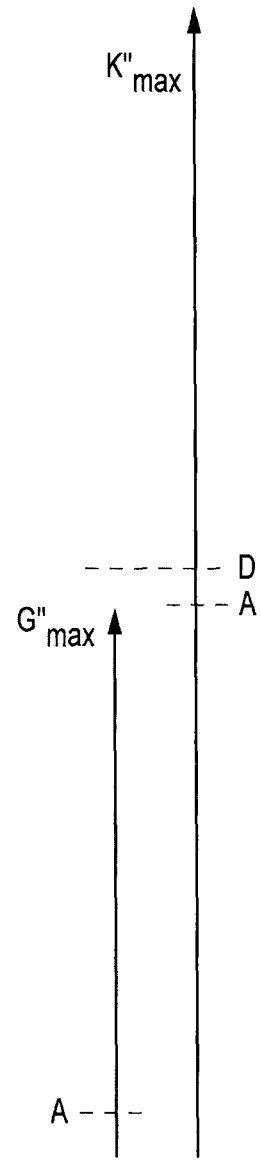

A mixer 14 is provided at each of the junctions between the channels 6a, 7a of the radio-frequency section 2 and the downstream channels 6b, 7b of the intermediate-frequency section 8, and converts the radio-frequency signal elements to an intermediate frequency, using the frequency of an oscillator 15. The signal elements which have been converted to the intermediate frequency are amplified by further low-noise amplifiers 13, whose gain ratios may be different. The maximum signal strengths $K''_{max}$ and $G''_{max}$ of the signal elements which have been amplified by the amplifiers 13 are illustrated in FIG. 4, with the magnitude ratios being distorted in comparison to FIG. 3, because the gain is expediently several orders of magnitude.

At the junction between the channels 6b, 7b of the intermediate-frequency section 8 and the downstream channels 6c, 7c of the baseband-frequency section 9, the analogue/digital converters 11, which are clocked by an oscillator 16, digitize the respective signal elements and pass digital signals to demodulators 17, which are likewise connected to the oscillators 16. The division ratio of the signal divider 5 and/or the gain of at least one amplifier 12, 13 are/is expediently designed such that the maximum signal element strength $G''_{max}$ in the channel 7 for strong signals makes optimum use of the dynamic range D of the analogue/digital converters 11, while the maximum signal element strength $K''_{max}$ in the channel 6 for weak signals considerably exceeds the dynamic range D, see FIG. 4. The circuitry is expediently designed such that a signal element in the channel 7 for strong signals can be processed and in particular digitized completely in the channel 6 for weak signals with a signal element strength below a threshold value A, at which a predetermined resolution can still be achieved, see FIG. 4.

For this purpose, the amplifiers 12, 13 can provide linear amplification or, in particular, non-linear amplification, for example logarithmic amplification, such that the region above the threshold value A in the channel 7 and the region below the threshold value A in the channel 6 are amplified more strongly than the respective other region, in order to stretch the respective region of interest, for more accurate digitizing.

The demodulators 17 determined the amplitude and phase of the respective signal element. Known I/Q demodulators can be used for this purpose. The demodulators 17 are expediently implemented by a digital signal processor or a computer program in a computer connected downstream from the analogue/digital converters 11. The computer may also be a microcontroller, an ASIC for example in the form of an FPGA or EPLD etc., or a digital signal processor or the like, in which case the software can be implemented as firmware.

The demodulators 17 are followed by a selection device 18 to whose input side the digital values for, for example, the amplitude and phase of the signal elements in the channels 6$c$, 7$c$ are supplied and which produces output signals at the outputs 10. In the simplest case, the selection device 18 selects that signal element which makes best use of the dynamic range to be output at the outputs 10, that is to say the signal element whose signal strength comes closest to the dynamic range D, without exceeding it. It is also possible to provide for the selection device 18 to identify those channels which are saturated. Furthermore, the phase differences and/or amplitude differences between the channels 6$c$, 7$c$ can be measured, in particular during a measurement and/or calibration time period, in order to correct the measured values on the basis of the differences during subsequent operation. The selection device 18 is expediently implemented together with the demodulators 17 as a computer program.

Instead of being followed by the intermediate-frequency section 5 as illustrated in FIG. 1, the radio-frequency section 2 can also be followed by some other lower-frequency section. In particular, the lower-frequency section may have a plurality of series-connected intermediate-frequency sections, no intermediate-frequency section but only one baseband-frequency section (zero-IF receiver, see FIG. 9) or a section with analogue/digital converters to the intermediate frequency or baseband frequency. Furthermore, analogue I/Q demodulators can be provided instead of the analogue/digital converters, with the components in the channels being designed for their dynamic range.

Figure 5:
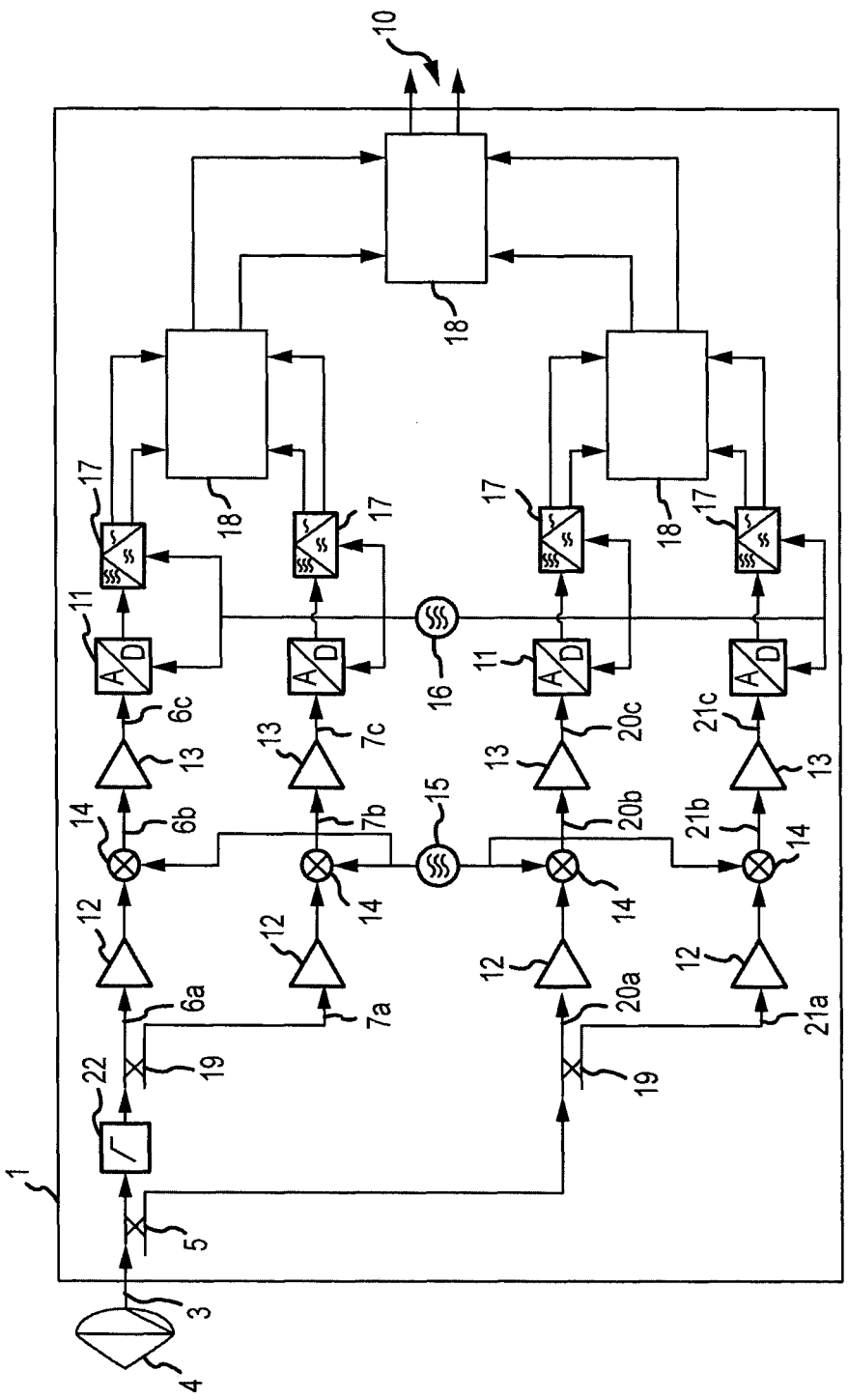
FIG. 5 shows a block diagram of a radio-frequency receiver having signal dividers connected in series in the form of a cascade.
Figure 6:
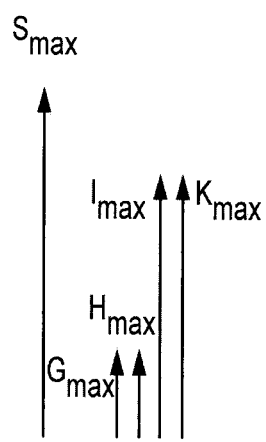
FIGS. 6, 7 and 8 illustrate signal elements at respectively different points in the radio-frequency receiver shown in FIG. 5.
Figure 7:
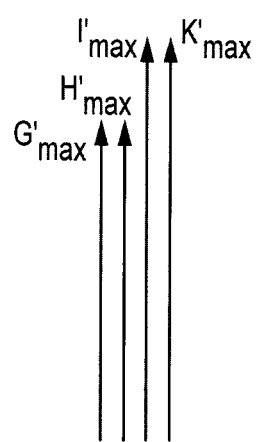
Figure 8:
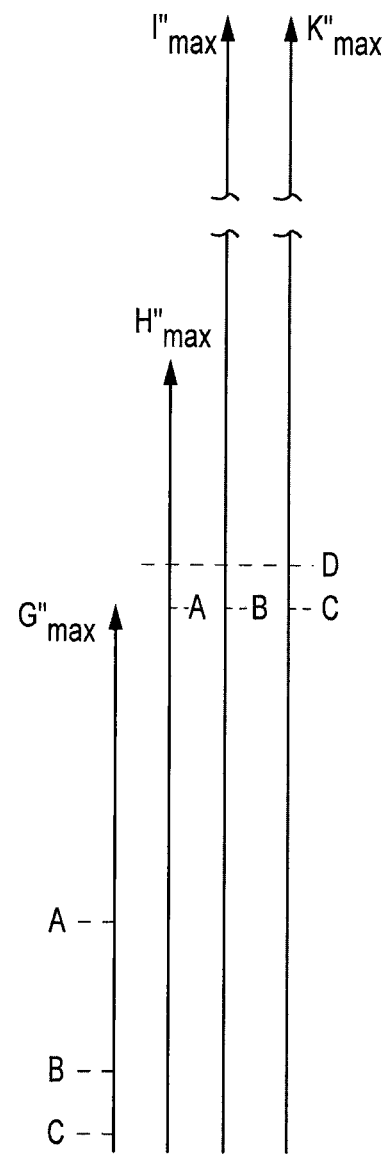

In the radio-frequency receiver illustrated in FIG. 5, the signal divider 5 is followed by signal dividers 19 in the form of a cascade, in order to split the signal between four channels 6, 7, 20, 21 for graduated signal strengths. Channel 6 is intended for the lowest signal strength, while channel 21 is intended for the highest signal strength. The maximum signal element strengths $G_{max}$, $H_{max}$, $I_{max}$, $K_{max}$, corresponding to the respective channels 21, 20, 7, 6 after division, $G'_{max}$, $H'_{max}$, $I'_{max}$, $K'_{max}$ after amplification by the amplifiers 12 and $G''_{max}$, $H''_{max}$, $I''_{max}$, $K''_{max}$ after amplification by the amplifiers 13 are illustrated in FIGS. 6 to 8, which correspond to FIGS. 2 to 4. In this case, the division ratio of the signal dividers 19 is 1:1, so that the signal element strengths $G_{max}$, $H_{max}$, and $I_{max}$, $K_{max}$ are each the same. The components are designed such that a signal at the input 3, which leads to an amplified signal element with a signal strength at the threshold value A, B or C as illustrated in FIG. 8, has a signal element strength in the channels 20, 7 or 6, respectively, which is just below the dynamic range D of the respective analogue/digital converter 11.

Furthermore, by way of example, a signal limiter 22 is provided for channels 6, 7 in FIG. 5. The signal limiter 22 prevents a signal with a strength which is above the greatest maximum permissible strength for the subsequent channels, that is to say in this case which is above the maximum permissible strength for the channel 7, being passed through, while the signals with a strength which can be processed in channel 6 or channel 7 are passed through. Signal limiters can also be provided individually for individual channels, expediently in each case upstream of the first amplifier in the respective channel. This makes it possible to effectively prevent components being damaged as a result of overdriving or voltage spikes, since the only signals which are passed through are those which can be processed in the downstream channel or the downstream channels. For example, the signal limiter 22 passes on only signal elements with a strength which is within the dynamic range D of the channel 7 after amplification. While the signal limiter 22 is working, signal detection is still possible on the other channels, which are designed for higher signal strengths and have no signal limiters, or no signal limiters which limit a signal element at the same time.

Figure 9:
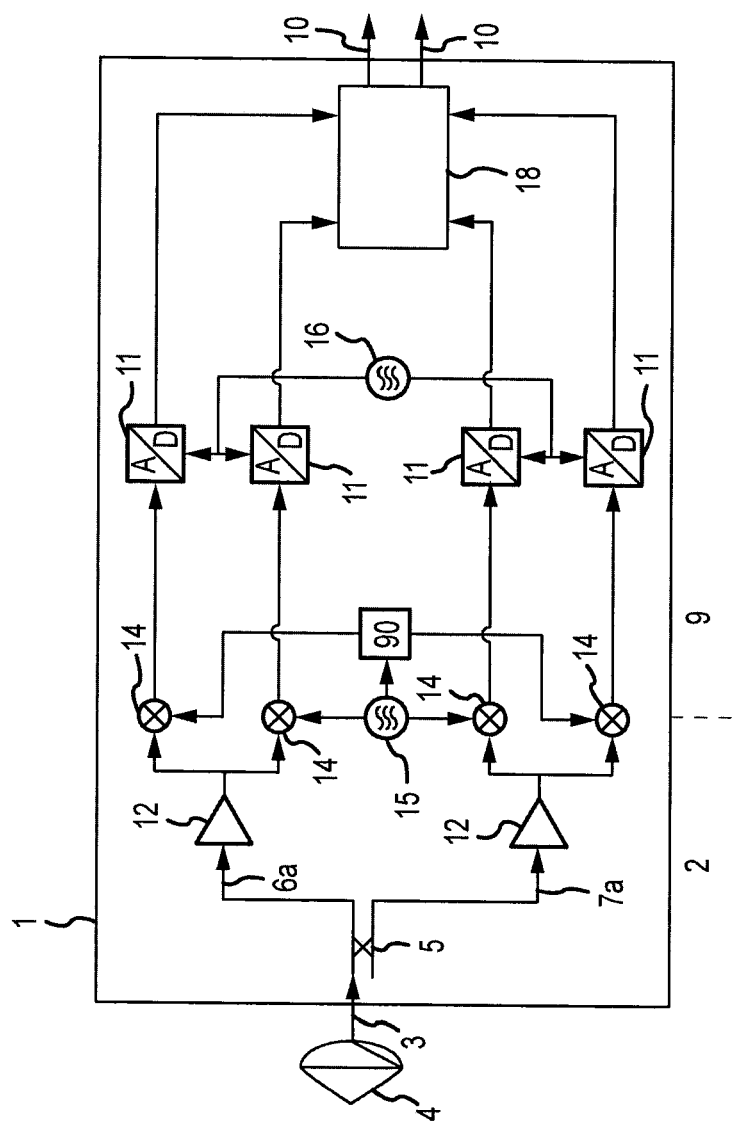
FIG. 9 shows a block diagram of a further radio-frequency receiver.

The embodiment as illustrated in FIG. 9 of a radio-frequency receiver 1 in the form of a so-called zero-IF receiver comprises a radio-frequency section 2 which is followed, directly via mixers 14, by a lower-frequency section, for example a baseband-frequency section 9, with A/D converters 11. In this case, demodulation is carried out quasi-directly from the radio-frequency section 2, without any intermediate-frequency section. Two mixers 14 are provided for this purpose in each channel, are fed with a phase shift of 90° from the oscillator 15 and carry out the demodulation process together with the A/D converters 11, two of which are likewise provided for each channel, in order in this case to separately supply I/Q data to the inputs of the selection apparatus for each channel, as in the case of the demodulator 17 shown in FIG. 1. In an alternative embodiment more than two mixers and/or more than two A/D converters can be provided in each channel.

Figure 10:
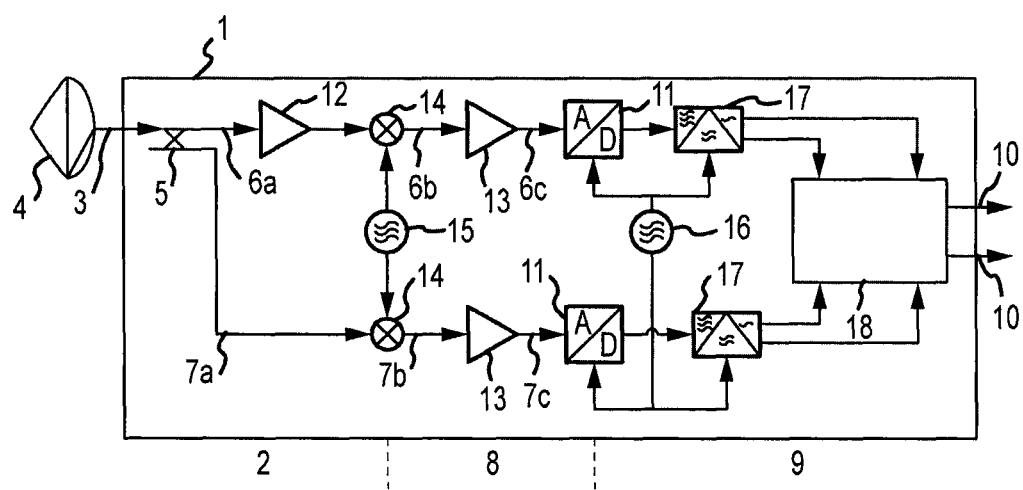
FIG. 10 shows schematically a further embodiment of a receiver according to the invention.

FIG. 10 shows a further embodiment of a receiver according to the invention. A radio-frequency analog signal from a receiving device 4 is input to a radio-frequency analog stage 2 of the receiver 1 at an input 3. A signal divider 5 is provided to split the signal into two sub-signals that are passed to two channels 6$a$, 7$a$, respectively. A low noise amplifier 12 is provided in the high frequency analog stage 2 of the receiver 1 to amplify the sub-signal in channel 6$a$ before it is passed to a mixer 14 for down-conversion to lower frequencies. The sub-signal in channel 7$a$ is passed to a second mixer 14 without amplification. The low noise amplifier 12 in channel 6$a$ therefore causes the sub-signal in the downstream channels 6$b$, 6$c$ to have a higher signal strength than the sub-signal in the downstream channels 7$b$, 7$c$. The signal divider 5 is preferably a symmetric signal divider, i.e. with a pre-established division ratio of 1:1. Alternatively the signal divider may be asymmetrical with a pre-established division ratio different from 1:1, preferably providing a higher signal strength to channel 6$a$, thereby further causing the sub-signals to have different signal strengths. By the different signal-processing, channel 6 is adapted to process input signals of low signal strength, while channel 7 is adapted for high input signal strengths.

Downstream from the mixers 14 in the lower frequency stages 8, 9 the receiver 1 corresponds to the embodiment illustrated in FIG. 1. The description pertaining to FIG. 1 applies accordingly.

The invention claimed is:

1. A multichannel radio-frequency receiver comprising:
a radio-frequency analog stage, configured to receive an input of a radio frequency electrical signal from a receiving device, the radio-frequency analog stage comprising a signal divider configured to:
split said electrical signal of one frequency into at least a first sub-signal and a second sub-signal having the same frequency as said electrical signal according to a pre-established division ratio, and
pass the at least first sub-signal and the second sub-signal to at least a first channel and a second channel, respectively, wherein:
the at least first channel and the second channel are designed for different signal strengths to widen the dynamic range, and
amplifiers with different amounts of gain are provided in the at least first channel and the second channel, causing said first sub-signal in said first channel and said second sub-signal in said second channel to have different signal strengths; and
a lower-frequency stage connected downstream from the radio-frequency analog stage comprising:
mixers to convert the radio-frequency of the at least first sub-signal and the second sub-signal into lower frequencies;
analog to digital converters each having a respective dynamic range to digitize the at least first sub-signal and the second sub-signal;
evaluation circuits for determining the phase and amplitude of the at least first sub-signal and the second sub-signal; and
a selection device configured to:
measure the phase and/or amplitude difference between the at least first sub-signal and the second sub-signal in order to correct the measured values of the phase and amplitude of the respective sub-signal on the basis of the phase and/or amplitude difference ascertained, and
employ the corrected measured values of each sub-signal to select one sub-signal from the at least first sub-signal and the second sub-signal for further processing based on determining which channel outputs the sub-signal with a signal strength closest to, without exceeding, a maximum of the respective dynamic range of that channel's analog to digital converter, the signal strength being dependent on the different amounts of gain of the amplifiers.

2. Receiver according to claim 1 wherein the pre-established division ratio of the signal divider further causes the first sub-signal and the second sub-signal to have different signal strengths.

3. Receiver according to claim 1 wherein the signal divider has a division ratio of 1:1.

4. Receiver according to claim 1 wherein the lower-frequency stage has a plurality of series-connected intermediate-frequency stages.

5. Receiver according to claim 1 wherein the amplifiers provide non-linear amplification to amplify more strongly a respective region of interest of the at least first or second sub-signal.

6. Receiver according to claim 1 wherein a signal strength limiter is connected downstream from the signal divider.

7. Receiver according to claim 1 wherein a plurality of signal dividers are connected in series, in form of a cascade.

8. Receiver according to claim 1, wherein the signal divider is configured to split the electrical signal into a plurality of sub-signals and to pass the plurality of sub-signals to a respective plurality of channels.

9. A multichannel radio-frequency receiver comprising:
a radio-frequency analog stage, configured to receive an input of a radio frequency electrical signal from a receiving device, the radio-frequency analog stage comprising a signal divider configured to:
split said electrical signal of one frequency into at least a first channel and a second sub-signal having the same frequency as said electrical signal according to a pre-established division ratio, and
pass the at least first sub-signal and the second sub-signal to at least a first channel and a second channel, respectively, wherein:
the at least first channel and the second channel are designed for different signal strengths to widen the dynamic range, and
the pre-established division ratio causes said first sub-signal in said first channel and said second sub-signal in said second channel to have different signal strengths; and
a lower-frequency stage connected downstream from the radio-frequency analog stage comprising:
mixers provided in each channel for I/Q demodulation by converting the radio-frequency of the at least first sub-signal and the second sub-signal to baseband frequencies and determining the phase and amplitude of the at least first sub-signal and the second sub-signal as I/Q data;
analog to digital converters each having a respective dynamic range to separately digitize the I/Q data of the at least first sub-signal and the second sub-signal; and
a selection device configured to:
measure the phase and/or amplitude difference between the at least first sub-signal and the second sub-signal in order to correct the measured values of the phase and amplitude of the respective sub-signal on the basis of the phase and/or amplitude difference ascertained, and
employ the corrected measured values of each sub-signal to select one sub-signal from the at least first sub-signal and the second sub-signal for further processing based on determining which channel outputs the sub-signal with a signal strength closest to, without exceeding, a maximum of the respective dynamic range of that channel's analog to digital converter, the signal strength being dependent on the pre-established division ratio.

10. Receiver according to claim 9 wherein amplifiers with different amounts of gain are provided in the at least first channel and the second channel further causing the at least first sub-signal and the second sub-signal to have different signal strengths.

11. Receiver according to claim 10 wherein the amplifiers provide non-linear amplification to amplify more strongly a respective region of interest of the at least first sub-signal or the second sub-signal.

12. Receiver according to claim 9 wherein the lower-frequency stage has a plurality of series-connected intermediate-frequency stages.

13. Receiver according to claim 9, wherein the signal divider is configured to split the electrical signal into a plurality of sub-signals and to pass the plurality of sub-signals to a respective plurality of channels.

14. A multichannel radio-frequency receiver comprising:
a radio-frequency analog stage, configured to receive an input of a radio frequency electrical signal from a receiving device, the radio-frequency analog stage comprising a signal divider configured to:
split said electrical signal of one frequency into at least a first sub-signal and a second sub-signal having the same frequency as said electrical signal according to a pre-established division ratio, and
pass the at least first sub-signal and the second sub-signal to at least a first channel and a second channel, respectively, wherein
the at least first channel and the second channel are designed for different signal strengths to widen the dynamic range; and
an amplifier provided in the at least first channel or in the at least second channel causing said first sub-signal in said first channel and said second sub-signal in said second channel to have different signal strengths; and
a lower-frequency stage connected downstream from the radio-frequency analog stage comprising:
mixers to convert the radio-frequency of the at least first sub-signal and the second sub-signal into lower frequencies;
analog to digital converters each having a respective dynamic range to digitize the at least first sub-signal and the second sub-signal;
evaluation circuits for determining the phase and amplitude of the at least first sub-signal and the second sub-signal; and
a selection device configured to:
measure the phase and/or amplitude difference between the at least first sub-signal and the second sub-signal in order to correct the measured values of the phase and amplitude of the respective sub-signal on the basis of the phase and/or amplitude difference ascertained, and
employ the corrected measured values of each sub-signal to select one sub-signal from the at least first sub-signal and the second sub-signal for further processing based on determining which channel outputs the sub-signal with a signal strength closest to, without exceeding, a maximum of the respective dynamic range of that channel's analog to digital converter, the signal strength being dependent on the different amplification in the at least first channel and the second channel.

15. Receiver according to claim 14 wherein the pre-established division ratio of the signal divider further causes the first sub-signal and the second sub-signal to have different signal strengths.

16. Receiver according to claim 14 wherein the signal divider has a division ratio of 1:1.

17. Receiver according to claim 14 wherein the amplifiers provide non-linear amplification to amplify more strongly a respective region of interest of the at least first or second sub-signal.

18. Receiver according to claim 14 wherein the lower-frequency stage has a plurality of series-connected intermediate-frequency stages.

19. Receiver according to claim 14 wherein the signal divider is configured to split the electrical signal into a plurality of sub-signals and to pass the plurality of sub-signals to a respective plurality of channels.

20. A multichannel radio-frequency receiver comprising:
a radio-frequency analog stage, configured to receive an input of a radio frequency electrical signal from a receiving device, the radio-frequency analog stage comprising a signal divider configured to:
split said electrical signal of one frequency into at least a first sub-signal and a second sub-signal having the same frequency as said electrical signal according to a pre-established division ratio, and
pass the at least first sub-signal and second sub-signal to at least a first channel and a second channel, respectively, wherein:
at least the first channel and the second channel are designed for different signal strengths to widen the dynamic range, and
the pre-established division ratio causes said first sub-signal in said first channel and said second sub-signal in said second channel to have different signal strengths; and
a lower-frequency stage having a plurality of series-connected intermediate-frequency stages connected downstream from the radio-frequency analog stage comprising:
mixers to convert the radio-frequency of the at least first sub-signal and the second sub-signal into lower frequencies of the intermediate-frequency stages;
analog to digital converters each having a respective dynamic range to digitize the at least first sub-signal and second sub-signal;
evaluation circuits for determining the phase and amplitude of the at least first sub-signal and the second sub-signal; and
a selection device configured to:
measure the phase and/or amplitude difference between the at least first sub-signal and the second sub-signal in order to correct the measured values of the phase and amplitude of the respective sub-signal on the basis of the phase and/or amplitude difference ascertained, and
employ the corrected measured values of each sub-signal to select one sub-signal from the at least first sub-signal and the second sub-signal for further processing based on determining which channel outputs the sub-signal with a signal strength closest to, without exceeding, a maximum of the respective dynamic range of that channel's analog to digital converter, the signal strength being dependent on the pre-established division ratio.

* * * * *